(12) United States Patent
Ahlawat et al.

(10) Patent No.: US 10,096,967 B2
(45) Date of Patent: Oct. 9, 2018

(54) WAVELENGTH CONTROL SYSTEM FOR PULSE-BY-PULSE WAVELENGTH TARGET TRACKING IN DUV LIGHT SOURCE

(71) Applicant: Cymer, LLC, San Diego, CA (US)

(72) Inventors: Rahul Ahlawat, San Diego, CA (US); Thomas P. Duffey, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 0 days.

(21) Appl. No.: 15/372,277

(22) Filed: Dec. 7, 2016

(65) Prior Publication Data

US 2018/0159297 A1 Jun. 7, 2018

(51) Int. Cl.
| | |
|---|---|
| *H01S 3/11* | (2006.01) |
| *H01S 3/106* | (2006.01) |
| *H01S 3/08* | (2006.01) |
| *G03F 7/20* | (2006.01) |

(52) U.S. Cl.
CPC ............ *H01S 3/106* (2013.01); *G03F 7/2006* (2013.01); *H01S 3/08004* (2013.01); *H01S 3/11* (2013.01)

(58) Field of Classification Search
CPC ..... H01S 3/106; H01S 3/08004; G03F 7/2006
See application file for complete search history.

(56) References Cited

U.S. PATENT DOCUMENTS

| | | | |
|---|---|---|---|
| 4,703,166 A | 10/1987 | Bruning et al. | |
| 4,952,945 A | 8/1990 | Hikima | |
| 6,625,191 B2 | 9/2003 | Knowles et al. | |
| 6,650,666 B2 | 11/2003 | Spangler et al. | |
| 7,630,424 B2 | 12/2009 | Ershove et al. | |
| 8,254,420 B2 | 8/2012 | Riggs et al. | |
| 8,705,004 B2 | 4/2014 | Butler et al. | |
| 9,785,050 B2 | 10/2017 | O'Brien et al. | |
| 2002/0154668 A1 | 10/2002 | Knowles et al. | |
| 2003/0090643 A1 | 5/2003 | Sato | |
| 2004/1795571 | 9/2004 | Govorkov et al. | |
| 2008/0315126 A1 | 12/2008 | Toki | |
| 2009/0067468 A1 | 3/2009 | Brown et al. | |
| 2011/0116522 A1* | 5/2011 | Riggs ................. | G03F 7/705 372/32 |
| 2015/0070673 A1 | 3/2015 | Lalovic et al. | |
| 2015/0190801 A1 | 7/2015 | Yokoi et al. | |
| 2015/0355025 A1 | 12/2015 | Duffey et al. | |

OTHER PUBLICATIONS

Wikipedia, Stepper, "https://en.wikipedia.org/w/inex/php?title=Stepper&oldid=689709653", Sep. 6, 2016.

* cited by examiner

*Primary Examiner* — Dung Nguyen
(74) *Attorney, Agent, or Firm* — Arent Fox LLP

(57) ABSTRACT

Wafer positioning errors in stepper-scanners contribute to imaging defects. Changing the wavelength of the light source's generated light can compensate for wafer positional errors in the Z-direction. The wafer's real-time z-position is determined and a change in wavelength target to offset this error is communicated to the light source. The light source uses this change in wavelength target in a feed-forward operation and, in an embodiment, in combination with existing feedback operations, on a pulse-by-pulse basis for subsequent pulses in a current burst of pulses in addition to receiving the newly-specified laser wavelength target for a subsequent burst of laser pulses.

23 Claims, 4 Drawing Sheets

WAVELENGTH CONTROL SYSTEM FOR PULSE-BY-PULSE WAVELENGTH TARGET TRACKING IN DUV LIGHT SOURCE

BACKGROUND

Field of the Invention

The disclosed subject matter is in the field of laser light control and more specifically in the field of controlling the wavelength of a laser light source as may be used in semiconductor photolithography processes.

Related Art

Photolithography is a commonly used process in the semiconductor industry. Modern photolithography typically uses a laser light source, also known as a laser system, to provide very narrow band light pulses that illuminate a mask thus exposing photo-resistive material on silicon wafers, also known as substrates, in stepper-scanner devices, also known as scanners. However, advances in semiconductor device parameters have put increasing demands on the performance characteristics of the laser light sources and stepper-scanners used. Improvements in precision and speed of operation of these devices are increasingly needed.

As is known in the art, the stepper-scanner device periodically communicates a specified wavelength target to the laser light source for the laser light to be generated. In turn, the laser light source generates the laser light as a burst (i.e., series or sequence) of pulses at that specified wavelength target and outputs it to the stepper-scanner for use in the photolithographic process. There are, however, numerous challenges in performing these operations. For example, disturbances in the laser light source affect how accurately it can generate the laser light at the specified wavelength target. Various feedback operations have been used in laser light sources to address those disturbances. Likewise, disturbances in the stepper-scanner devices affect how steadily the stepper-scanner can hold the wafer. Various feedback operations have been used in stepper-scanners to address those disturbances. What is needed are further improvements in how the laser light source and stepper-scanner address such disturbances.

SUMMARY

A system and method for controlling the wavelength of a laser pulse, on a pulse-by-pulse basis in a burst of laser pulses, using a received change in wavelength target based on a determined wafer positional error, is shown and described herein with reference to a number of specific embodiments.

In one embodiment is a method of laser wavelength control comprising: (a) receiving, in a laser system controller, a newly-specified laser wavelength target; (b) generating, by the laser system, a burst of laser pulses at the newly-specified laser wavelength target; (c) receiving, in the laser system controller, a change in wavelength target based on a measured wafer positional error; (d) adjusting a prism position in the laser system based on the received change in wavelength target; (e) generating, by the laser system, a next laser pulse of the burst of laser pulses using the adjusted prism position; and, (f) repeating steps (c)-(e) as additional changes in wavelength target are received by the laser system. In a further embodiment, the method further comprises repeating steps (a) through (f) when another newly-specified laser wavelength target is received. In a still further embodiment, adjusting the prism position in the laser system is based on a feed-forward operation and in a yet still further embodiment is also based on a feedback operation.

In another embodiment is a laser system for pulse-by-pulse laser wavelength control comprising: a laser source; a line narrowing module including a prism; a piezoelectric transducer and drive electronics; and, a controller configured to: (a) receive a newly-specified laser wavelength target; (b) direct the laser source to begin generating a burst of laser pulses at the newly-specified laser wavelength target; (c) receive a change in wavelength target based on a measured wafer positional error; (d) adjust, based on the received change in wavelength target, a prism position in the line narrowing module using the piezoelectric transducer and drive electronics; (e) direct the laser source to generate a next laser pulse of the burst of laser pulses passing through the adjusted prism position; and, (f) repeat steps (c)-(e) as additional changes in wavelength target are received. In a further embodiment, the controller is further configured to repeat steps (a) through (f) when another newly-specified laser wavelength target is received. In a still further embodiment, the controller is further configured to adjust the prism position based on a feed-forward operation and in a yet still further embodiment is also based on a feedback operation.

BRIEF DESCRIPTION OF THE DRAWING

Various embodiments are disclosed in the following detailed description and the accompanying drawing.

DETAILED DESCRIPTION

Described herein is a system and method for controlling the wavelength of a laser light source generated laser pulse to compensate for wafer stage movement in a stepper-scanner device as may be used in semiconductor photolithography. In addition to receiving a newly-specified laser light wavelength target for a subsequent burst of pulses, the laser light source also receives a change in wavelength target, determined by and communicated from the stepper-scanner, which the laser light source then uses in a feed-forward operation to adjust the generated laser light on a pulse-by-pulse basis for subsequent pulses generated within the current burst of pulses. In a further embodiment, this feed-forward operation is used in conjunction with a feedback operation to adjust the generated laser light. The operations and elements of this system and method will now be described.

Figure 1:
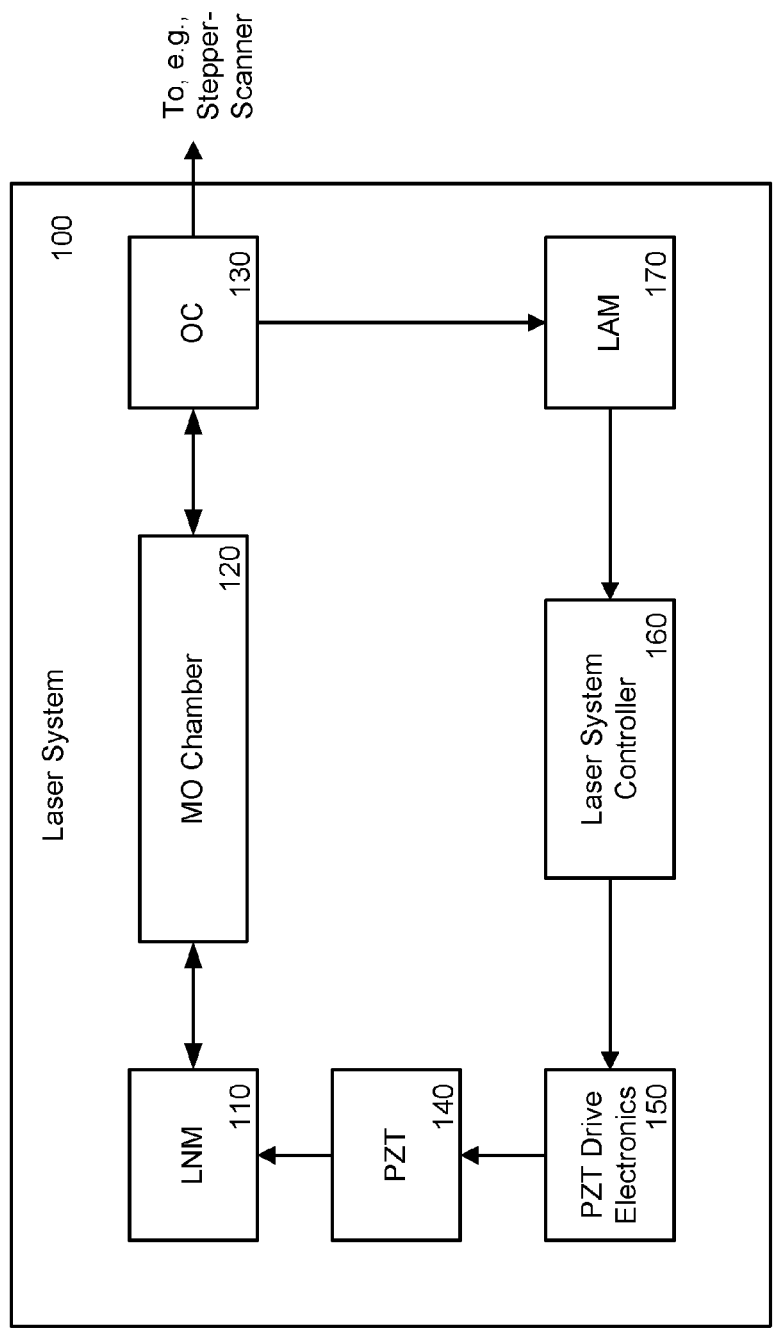
FIG. 1 is a block diagram of an exemplary laser system as may be used in one embodiment.

Referring now to FIG. 1, a block diagram of a laser light source or laser system 100 as may be used in a modern deep ultraviolet ("DUV", e.g., having wavelengths of 248 nanometers (nm) or 193 nm) photolithography process can be seen. The source of the light in laser system 100 is a master oscillator (MO) chamber 120.

As is known in the art, when MO chamber 120 fires the resulting laser light enters Line Narrowing Module (LNM) 110 where it shines through a prism (actually several prisms) and onto a grating within LNM 110. This acts as a wavelength selector in that changing the position of the prism in LNM 110 changes the wavelength of the laser light which, as is also known in the art, in turn affects the focus at an imaging plane in the scanner. This changed wavelength laser light passes back through MO chamber 120 to an output coupler (OC) 130 and then on to a stepper-scanner device (not shown) that is responsible for handling and exposing the semiconductor wafer. While the example here uses a single chamber system, the process is similar in a dual chamber system and, in light of the teachings herein, the present approach is equally applicable to either a single chamber system or a dual chamber system.

It is to be noted that elements and operation of laser system 100 and in particular LNM 110, including the prisms and grating, are known in the art (see, e.g., U.S. application Ser. No. 14/794,508, commonly owned by the assignee of the present application and incorporated by reference herein in its entirety).

Output coupler 130 also passes the laser light output from MO chamber 120 to a Line-center Analysis Module (LAM) 170. LAM 170 is a wavelength sampler which measures the wavelength of the light output from MO chamber 120. The laser light output measurement is then passed from LAM 170 to a laser system controller 160.

In a feedback operation, laser system controller 160 uses the light output measurement received from LAM 170 to determine what changes need to be made to reposition the prism in LNM 110 to reduce wavelength error. Wavelength error is calculated from the specified wavelength target. The position of the prism in LNM 110 is controlled by a voltage applied to a piezoelectric transducer (PZT) 140 connected to the prism in LNM 110. Laser system controller 160 therefore determines what voltage should be applied to PZT 140 to achieve the new desired prism position.

Laser System controller 160 outputs to PZT drive electronics 150 a digital signal indicating the desired voltage to be applied to the PZT 140. PZT drive electronics 150 comprise a digital-to-analog converter (DAC), which converts the controller 160 digital signal to an analog voltage signal, and an analog low pass filter, which reduces high-frequency electrical noise and amplifies the analog DAC voltage signal. This analog voltage signal is then passed from PZT drive electronics 150 to PZT 140 which repositions the prism in LNM 110 which in turn causes a change in the wavelength of the light output from MO chamber 120 through output coupler 130 at the next laser firing event.

Other known algorithms and approaches have been used by and with laser system controller 160 to direct the prism position in LNM 110 according to the above-described feedback loop. As known in the art, various disturbances in laser system 110 make the generated laser light wavelength of the laser system fluctuate and/or change during a burst and due to the dynamics of the PZT, the laser system controller 160 cannot simply position the prism in LNM 110 to reject these disturbances. One prior approach, disclosed in U.S. Pat. No. 8,254,420, incorporated by reference herein in its entirety, addresses these disturbances by having laser system controller 160 predict the laser light wavelength using a model of the prism's motion characteristics and laser disturbances, and calculates the PZT voltage needed to reduce the predicted laser wavelength error. The model states are then updated when a laser output wavelength measurement is obtained by LAM 170. Since PZT voltages are calculated based on predicted wavelength errors, this method allows application of PZT voltage at a different rate (usually a higher rate) than the rate at which pulses are generated.

This overall process continues for each laser pulse in the current burst of laser pulses. At some point in time (e.g., typically every few seconds), the stepper-scanner communicates a request for another burst of light pulses from the laser system at a newly-specified wavelength target. As a result, the laser system then generates a new burst of laser pulses using the newly-specified wavelength target.

Figure 2:
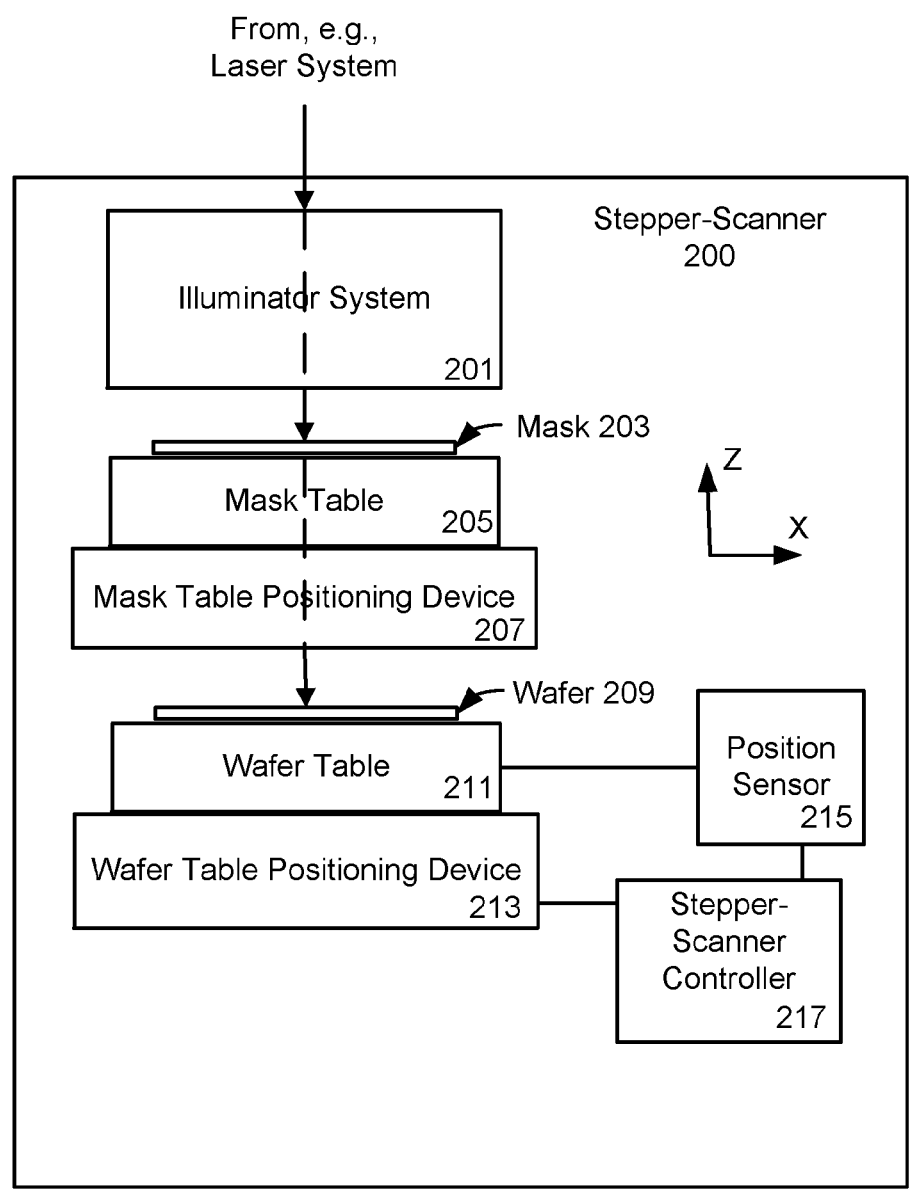
FIG. 2 is a block diagram of an exemplary stepper-scanner as may be used in one embodiment.

As stated above, the resulting laser light ultimately passes from laser system 100 to a stepper-scanner that is responsible for handling and exposing the semiconductor wafer. Referring now to FIG. 2, a block diagram of an exemplary stepper-scanner 200 can be seen. Stepper-scanner 200 receives the laser light pulses from the laser system into an illuminator system 201 which comprises a series of optical elements that control and direct the received laser light to and through a photolithography mask 203 located on a mask table 205. Mask table 205, and in turn mask 203, is positioned by a mask table positioning device 207. The laser light passes through mask 203 (and through a projection system, not shown but known in the art) to a wafer 209 located on a wafer table 211. Wafer table 211, and in turn wafer 209, is positioned by a wafer positioning device 213. A position sensor 215, e.g., one or more interferometers or planer encoders, measures the position of wafer 209 either directly or indirectly by measuring the position of wafer table 211.

However, for various reasons known in the art and as described in U.S. Pat. No. 8,705,004, commonly owned by the assignee of the present application and incorporated by reference herein in its entirety, the wafer does not always remain in a steady position within the stepper-scanner while being exposed to the laser light. For example, although the stepper-scanner (e.g., stepper-scanner 200) may desirably move the wafer (e.g., wafer 209) along a plane that is perpendicular to the optical axis of the laser light beam, there may be an undesirable change in position of a holder (e.g., wafer table 211) of the wafer or undesirable change in position of a positioning device (e.g., wafer table positioning device 213) of the holder of the wafer along the optical axis of the laser light beam (commonly referred to as the "Z-axis" and as indicated on FIG. 2). Therefore, a measurement device (e.g., position sensor 215) such as one or more interferometers is typically used in stepper-scanners to measure the position of the substrate (e.g., wafer 209) along the Z-axis. A controller (e.g., stepper-scanner controller 217) within the stepper-scanner uses this positional measurement to determine how to reposition the wafer along the Z-axis, in a feedback operation within the stepper-scanner, to obtain the desired exposure of the laser light on the wafer.

In some instances, such stepper-scanner feedback operations are also known to take into account various disturbances in the stepper-scanner to further improve the controller's determination of how to reposition the wafer along the Z-axis. The stepper-scanner may ultimately determine that an entirely new laser light wavelength target is needed, in addition to or instead of simply repositioning the wafer, and therefore communicate a newly-specified laser light wavelength target to the laser system for the next burst of light pulses to be generated by the laser system. However, there may be a number of laser light pulses remaining to be generated in a current burst which would not be altered by the newly-specified laser light wavelength and these remaining laser light pulses would therefore not address or overcome the present wafer stage movement or positional error. Desired laser focus on the wafer would therefore not be obtained for those remaining laser light pulses. Conversely, the present approach addresses this, as will now be explained.

The present approach operates as follows. One or more measurement devices, e.g., interferometers or planer encoders, in the stepper-scanner measures a current position of the wafer along the Z-axis. A controller in the stepper-scanner uses this measured wafer position to calculate a wavelength error correction to compensate for the wafer stage movement. During the current burst of laser pulses, the stepper-scanner communicates this wavelength error correction as a change in wavelength target to the laser system in real-time, either via the same communication mechanism used by the stepper-scanner to communicate a newly-specified laser light wavelength target or via a new communication mechanism such as a high speed serial interface. Also, the laser system uses the changes in wavelength target as time-varying setpoints in a feed-forward operation, and in a preferred embodiment in combination with any existing feedback operation, to reposition the prism in the line-narrowing module thereby causing the laser light generated in the master oscillator chamber to be stable and of the desired wavelength target by the scanner. This generated laser light thus compensates for any disturbances within the laser system, via the existing feedback operation, and also compensates for wafer stage movement in the stepper-scanner, via the feed-forward operation. This sequence of events continues for the entire burst of pulses to continuously adjust the wavelength of the generated light, on a pulse-by-pulse basis, to compensate for movement or positional error of the wafer substrate along the Z-axis.

Figure 3:
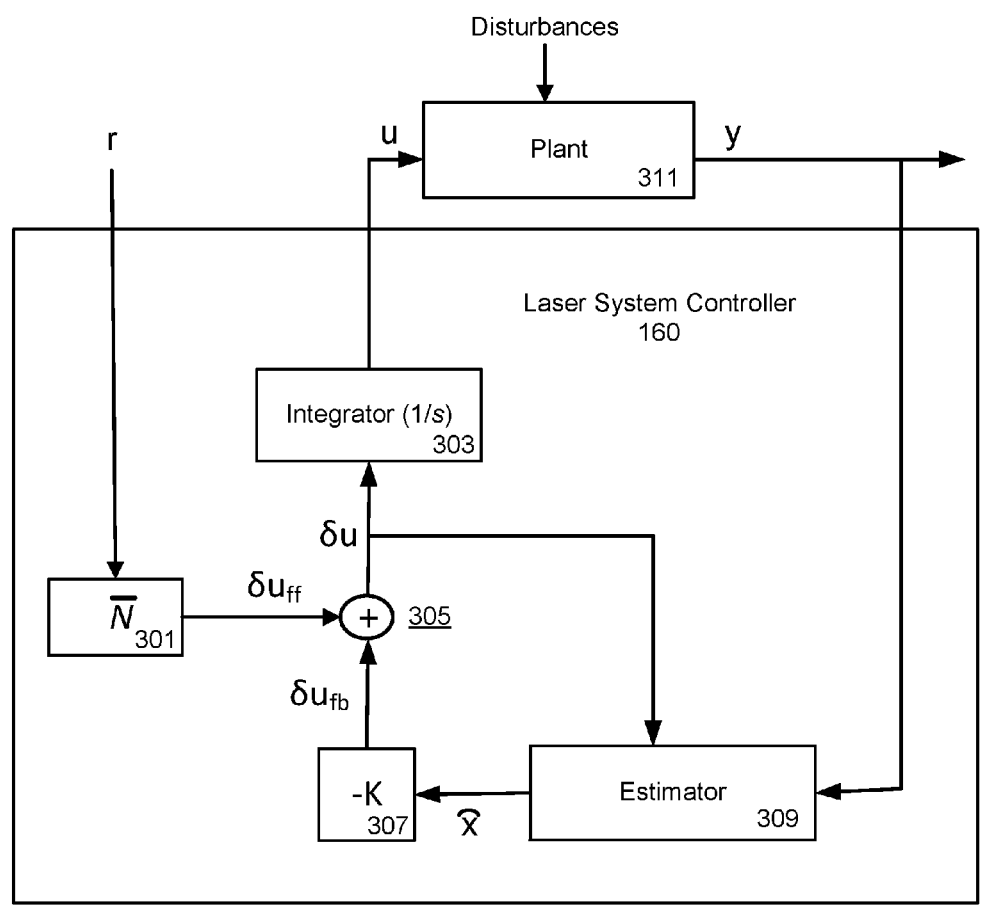
FIG. 3 is a block diagram of the feedback and feed-forward operations as may be used in one embodiment.

Referring now to FIG. 3, a block diagram of the feedback and feed-forward operations will now be further described. As shown, plant 311, comprising LNM 110, MO chamber 120 and LAM 170 of laser system 100 of FIG. 1, is in communication with laser system controller 160 of laser system 100 of FIG. 1 to perform the various operations described herein.

As shown and as is known, the prior art feedback operation is based on a model of actuator (e.g., PZT) dynamics and known disturbances within the laser system which model is represented by estimator 309 that estimates model states, $\hat{x}$. This estimator is based on a Kalman filter paradigm and updates the estimates when a laser wavelength measurement is available (e.g., from LAM 170). Full state feedback gain, K, 307 is then multiplied by state estimates to calculate the feedback actuation signal (e.g., change in PZT voltage ($\delta u_{fb}$)), which is integrated by integrator 303 and sent to the PZT in plant 311. This control system forms the feedback approach known in the art.

The approach described herein preserves this existing controller structure and performance while also being able to follow a dynamic reference trajectory, r, which is the wavelength target changes received from the stepper-scanner. To achieve dynamic target tracking capability, a feed-forward loop is used that interoperates with the existing feedback operation and controller without requiring change to its underlying structure. The present approach multiplies the desired reference, r, with a time-variable gain, $\overline{N}$, 301 to obtain the feed-forward component of change in PZT voltage, $\delta u_{ff}$. This $\delta u_{ff}$ is then added to $\delta u_{fb}$ in adder 305 to obtain the total change in PZT voltage, $\delta u$, which is then integrated in integrator 303 before being sent to the actuator, e.g., PZT, in plant 311. The variable gain, $\overline{N}$, is calculated such that the loop transfer function from target (=r) to wavelength (=y) has a unit gain. Hence, this gain is calculated as:

$$\overline{N}^{-1} = [C \ 0] \begin{bmatrix} I - A + BK & BK \\ 0 & I - A + LC \end{bmatrix}^{-1} \begin{bmatrix} B \\ 0 \end{bmatrix}$$

where A is the System matrix, B is the Input matrix, C is the Output matrix, I is the Identity matrix, K is the Full state feedback gain matrix, and L is the Estimator gain matrix.

The changes in wavelength target, communicated from the stepper-scanner, are received at a very high rate (e.g., 20 kHz or more, therefore every 50 milliseconds) relative to receiving a newly-specified wavelength target every few seconds, and in a preferred embodiment the combined feedback and feed-forward controller is also executed at the same rate. Since the feed-forward loop only uses the latest trajectory values, and not actual wavelength measurements, this method is robust against measurement delay or missed measurements.

As is thus clear, a newly-specified wavelength target is received every few seconds while a change to this wavelength target is received approximately every 50 milliseconds. Further, to reduce processing time and communication delays, in a preferred embodiment laser system controller 160 of FIG. 1 is implemented as a single controller that handles the functions of multiple controllers of the prior art (e.g., the LAM 170, the laser system controller 160 and PZT drive electronics 150, each as is known in the art). Still further, in a preferred embodiment, PZT 140 of FIG. 1 uses a PZT with a higher-resonant frequency band for improved performance and isolation from stage measurement frequencies.

Figure 4:
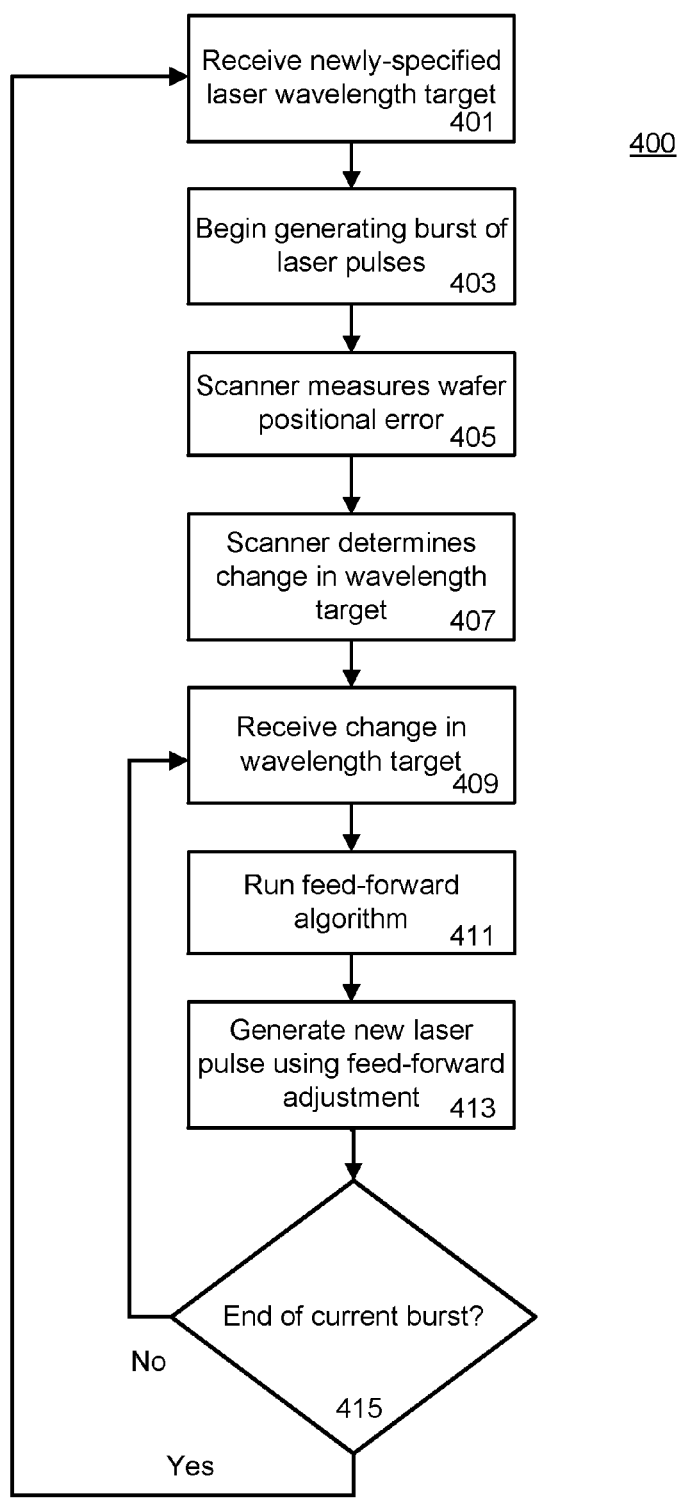
FIG. 4 is a flowchart of one embodiment of the present method.

Referring now to FIG. 4, a flowchart of one embodiment of the present method 400 can be seen.

In an operation 401, a specified wavelength target for a new burst of laser pulses is received by a laser source, e.g., laser system 100, in a communication from a stepper-scanner, e.g., scanner 200. For discussion purposes, the specified wavelength target is also referred to herein as a desired central wavelength target and a newly-specified wavelength target is typically communicated every few seconds.

In an operation 403, the laser source begins generating a burst, i.e., a series, of laser pulses at the specified wavelength target.

In an operation 405, the stepper-scanner measures wafer positional error using one or more position sensors, e.g., via one or more interferometer.

In an operation 407, the stepper-scanner (e.g., using a controller within stepper-scanner) determines a change in wavelength target to address the measured wafer positional error. Separately, the controller within the stepper-scanner may also use this measured positional error to perform some positional error feedback correction within the stepper-scanner, using techniques known in the art.

In an operation 409, the change in wavelength target is received by the laser source in a communication from the stepper-scanner.

In an operation 411, the feed-forward algorithm is run using the received change in wavelength target to create a new value for adjusting a prism in the laser system. In an embodiment this algorithm is run in a controller, e.g., laser system controller 160, in the laser source. In a preferred embodiment, in operation 411, a feedback algorithm is also run within the controller in the laser source using techniques known in the art and the results of the feed-forward algorithm and the feedback algorithm are combined to create the new value for adjusting the prism in the laser source.

In an operation 413, the laser source generates a new laser pulse in the current burst using the new prism adjustment value. In other words, the prism is adjusted using the new prism adjustment value and the laser source generates a new laser pulse that passes through the adjusted prism.

In an operation 415, a determination is made regarding whether the end of the current burst (or, equivalently, a new burst start time) has been reached. If not, then the process continues by returning to step 409 to generate further laser pulses in the current burst (which, it is to be noted, may be based on further scanner measurements and determinations in repeated steps 405 and 407 and therefore on further changes in wavelength target). Otherwise, the process returns to step 401 to receive a newly-specified wavelength target and start generating a new burst of laser pulses.

The embodiments discussed herein are illustrative of the present invention. As these embodiments of the present invention are described with reference to illustrations, various modifications or adaptations of the methods and or specific structures described may become apparent to those skilled in the art. All such modifications, adaptations, or variations that rely upon the teachings of the present invention, and through which these teachings have advanced the art, are considered to be within the spirit and scope of the present invention. Hence, the description and the drawing should not be considered in a limiting sense, as it is understood that the present invention is in no way limited to only the embodiments illustrated.

It is also to be understood that alternative sequences and mathematical formulas could be used within the spirit and meaning of the present invention as described herein.

Likewise, it is to be understood that laser system controller 160 can be any computing system comprising a processor and memory, including a personal computer, server, or other processing system, that runs software instructions for performing the described operations which instructions may themselves have come from or reside on a computer readable storage medium. Alternatively, laser system controller 160 can be any dedicated hardware such as an application specific integrated circuit (ASIC) or other hardwired device, with or without firmware, that is specifically configured to perform the described operations.

What is claimed is:

1. A method of laser wavelength control comprising:
   (a) receiving, in a laser system controller, a newly-specified laser wavelength target;
   (b) generating, by the laser system, a burst of laser pulses at the newly-specified laser wavelength target;
   (c) receiving, in the laser system controller, a change in wavelength target based on a measured wafer positional error;
   (d) adjusting a prism position in the laser system based on the received change in wavelength target;
   (e) generating, by the laser system, a next laser pulse of the burst of laser pulses using the adjusted prism position; and,
   (f) repeating steps (c)-(e) as additional changes in wavelength target are received by the laser system.

2. The method of claim 1 further comprising repeating steps (a) through (f) when another newly-specified laser wavelength target is received.

3. The method of claim 1 wherein the newly-specified wavelength target is received in the laser system every several seconds.

4. The method of claim 1 wherein the changes in wavelength target are received in the laser system approximately every 50 milliseconds.

5. The method of claim 1 wherein adjusting the prism position in the laser system is based on a feed-forward operation using the formula:

$$\overline{N}^{-1} = [C \ 0] \begin{bmatrix} I - A + BK & BK \\ 0 & I - A + LC \end{bmatrix}^{-1} \begin{bmatrix} B \\ 0 \end{bmatrix}$$

where N is a variable gain, A is a System matrix, B is an Input matrix, C is an Output matrix, I is an Identity matrix, K is a Full state feedback gain matrix, and L is an estimator gain matrix.

6. The method of claim 5 wherein adjusting the prism position in the laser system based on a feed-forward operation is also based on a feedback operation.

7. A laser system for pulse-by-pulse laser wavelength control comprising:
   a laser source;
   a line narrowing module including a prism;
   a piezoelectric transducer and drive electronics; and,
   a controller configured to:
   (a) receive a newly-specified laser wavelength target;
   (b) direct the laser source to begin generating a burst of laser pulses at the newly-specified laser wavelength target;
   (c) receive a change in wavelength target based on a measured wafer positional error;
   (d) adjust, based on the received change in wavelength target, a prism position in the line narrowing module using the piezoelectric transducer and drive electronics;
   (e) direct the laser source to generate a next laser pulse of the burst of laser pulses passing through the adjusted prism position; and,
   (f) repeat steps (c)-(e) as additional changes in wavelength target are received.

8. The laser system of claim 7 wherein the controller is further configured to repeat steps (a) through (f) when another newly-specified laser wavelength target is received.

9. The laser system of claim 7 the controller configured to adjust the prism position is based on a feed-forward operation using the formula:

$$\overline{N}^{-1} = [C \ 0] \begin{bmatrix} I - A + BK & BK \\ 0 & I - A + LC \end{bmatrix}^{-1} \begin{bmatrix} B \\ 0 \end{bmatrix}$$

where N is a variable gain, A is a System matrix, B is an Input matrix, C is an Output matrix, I is an Identity matrix, K is a Full state feedback gain matrix, and L is an estimator gain matrix.

10. The laser system of claim 9 wherein the controller is configured to adjust the prism position based at least in part on a feed-forward operation and also based at least in part on a feedback operation.

11. In a photolithography system, a method of performing photolithography on a wafer using laser light generated using a laser system, comprising:
   receiving a laser wavelength target;
   generating a first plurality of laser pulses in a burst of laser pulses at the laser wavelength target;
   measuring a wafer positional error;
   obtaining a change in wavelength target based on the measured wafer positional error;

adjusting a position of a prism in the laser system based on the obtained change in wavelength target; and generating a second plurality of laser pulses of the burst of laser pulses using the adjusted prism position, wherein the step of adjusting the prism position in response to the received change in wavelength target occurs at a greater frequency than the step of receiving the laser wavelength target.

12. The method of claim 11 wherein the change in wavelength target represents a wavelength error correction calculated at least in part based on the measured wafer positional error.

13. The method of claim 12 wherein the change in wavelength target is computed without measuring wavelength.

14. The method of claim 11 wherein the change in wavelength target is generated without measuring wavelength.

15. The method of claim 11 further comprising receiving a second laser wavelength target having a different value than a value of the laser wavelength target of step a) and repeating steps (b) through (e) with the second laser wavelength target.

16. A laser system for pulse-by-pulse laser wavelength control comprising:
   a laser source for producing a laser beam;
   a line narrowing module including at least one prism in an optical path of the laser beam;
   a sensor for measuring a wafer positional error;
   a piezoelectric transducer mechanically coupled to the prism arranged to receive the laser beam;
   drive electronics electrically connected to the piezoelectric transducer; and,
   a controller electrically coupled to the laser source and the sensor and configured to:
      receive a newly-specified laser wavelength target;
      direct the laser source to begin generating a first plurality of pulses of a burst of laser pulses at the newly-specified laser wavelength target;
      receive a change in wavelength target based on the measured wafer positional error;
      adjust, based on the received change in wavelength target, a prism position in the line narrowing module using the drive electronics;
      direct the laser source to generate a next plurality of pulses of the laser pulse of the burst of laser pulses passing through the adjusted prism position;
      receive a second newly-specified wavelength target;
      direct the laser source to begin generating a first plurality of pulses of a burst of laser pulses at the second newly-specified laser wavelength target;
      receive a second change in wavelength target based on the measured wafer positional error; and
      adjust, based on the received second change in wavelength target, a prism position in the line narrowing module using the drive electronics;
      direct the laser source to generate a new plurality of pulses passing through the adjusted prism position.

17. The laser system of claim 16 the controller configured to adjust the prism position is based on a feed-forward operation using the formula:

$$\overline{N}^{-1} = [\,C\ \ 0\,]\begin{bmatrix} I - A + BK & BK \\ 0 & I - A + LC \end{bmatrix}^{-1}\begin{bmatrix} B \\ 0 \end{bmatrix}$$

where N is a variable gain, A is a System matrix, B is an Input matrix, C is an Output matrix, I is an Identity matrix, K is a Full state feedback gain matrix, and L is an estimator gain matrix.

18. The laser system of claim 16 wherein the controller is configured to adjust the prism position based at least in part on a feed-forward operation and at least in part on a feedback operation.

19. The method of claim 11 wherein the step of adjusting the prism position comprises adjusting the prism position based at least in part on a feed-forward operation using the formula:

$$\overline{N}^{-1} = [\,C\ \ 0\,]\begin{bmatrix} I - A + BK & BK \\ 0 & I - A + LC \end{bmatrix}^{-1}\begin{bmatrix} B \\ 0 \end{bmatrix}$$

where N is a variable gain, A is a System matrix, B is an Input matrix, C is an Output matrix, I is an Identity matrix, K is a full state feedback gain matrix, and L is an estimator gain matrix.

20. The method of claim 11 further comprising performing a feedback operation that generates the laser wavelength targets received in step a).

21. The method of claim 11 further comprising simultaneously performing a feedback operation for repositioning a scanner table on which the substrate is disposed in response to the measured wafer positional error.

22. The method of claim 21 wherein the step of receiving a laser wavelength target is based at least in part by the feedback operation.

23. The method of claim 11 wherein the laser wavelength target is received for the burst of laser pulses, wherein the burst occurs over a time interval T and wherein the step of adjusting the prism position based on the received change in wavelength target is performed during the time interval T.

* * * * *